United States Patent
Shepelev (10) Patent No.: US 10,067,587 B2
(45) Date of Patent: Sep. 4, 2018

(54) ROUTING CONDUCTORS IN AN INTEGRATED DISPLAY DEVICE AND SENSING DEVICE

(71) Applicant: SYNAPTICS INCORPORATED, San Jose, CA (US)

(72) Inventor: Petr Shepelev, Campbell, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 213 days.

(21) Appl. No.: 14/983,218

(22) Filed: Dec. 29, 2015

(65) Prior Publication Data

US 2017/0185197 A1 Jun. 29, 2017

(51) Int. Cl.
- *G06F 3/041* (2006.01)
- *G06F 3/044* (2006.01)
- *H01L 27/32* (2006.01)

(52) U.S. Cl.
CPC ............ *G06F 3/0412* (2013.01); *G06F 3/044* (2013.01); *G06F 3/0416* (2013.01); *H01L 27/323* (2013.01)

(58) Field of Classification Search
CPC .............................................. G09G 2300/0426
See application file for complete search history.

(56) References Cited

U.S. PATENT DOCUMENTS

| | | | |
|---|---|---|---|
| 4,087,625 A | 5/1978 | Dym et al. | |
| 4,233,522 A | 11/1980 | Grummer et al. | |
| 4,237,421 A | 12/1980 | Waldron | |
| 4,264,903 A | 4/1981 | Bigelow | |
| 4,293,987 A | 10/1981 | Gottbreht et al. | |
| 4,484,026 A | 11/1984 | Thornburg | |
| 4,492,958 A | 1/1985 | Minami | |
| 4,550,221 A | 10/1985 | Mabusth | |
| 4,550,310 A | 10/1985 | Yamaguchi et al. | |

(Continued)

FOREIGN PATENT DOCUMENTS

| CN | 2436978 Y | 6/2001 |
|---|---|---|
| CN | 1490713 A | 4/2004 |

(Continued)

OTHER PUBLICATIONS

Shawn Day. "Low Cost Touch Sensor on the Underside of a Casing", IP.com. Oct. 14, 2004.

(Continued)

*Primary Examiner* — Robin Mishler
(74) *Attorney, Agent, or Firm* — Patterson + Sheridan, LLP (57) ABSTRACT

An example display device includes an active portion having a plurality of display electrodes, an inactive portion, a plurality of source lines disposed at least partially in the active portion, and a plurality of routing traces. The routing traces include a first routing trace, at least a first portion thereof being disposed in a first metal layer, parallel to a first source line of the plurality of source lines and in the active portion. The routing traces further include a second routing trace, a first portion thereof disposed parallel to the first routing trace in the first metal layer and in the active portion, a second portion of the second routing trace disposed in a second metal layer in the inactive portion and crossing the first routing trace, the second routing trace coupled to a first display electrode of the plurality of display electrodes through a first via.

24 Claims, 6 Drawing Sheets

(56) References Cited

U.S. PATENT DOCUMENTS

| | | |
|---|---|---|
| 4,659,874 A | 4/1987 | Landmeier |
| 4,667,259 A | 5/1987 | Uchida et al. |
| 4,677,259 A | 6/1987 | Abe |
| 4,705,919 A | 11/1987 | Dhawan |
| 4,771,138 A | 9/1988 | Dhawan |
| 4,878,013 A | 10/1989 | Andermo |
| 4,954,823 A | 9/1990 | Binstead |
| 4,999,462 A | 3/1991 | Purcell |
| 5,053,715 A | 10/1991 | Andermo |
| 5,062,916 A | 11/1991 | Aufderheide et al. |
| 5,239,307 A | 8/1993 | Andermo |
| 5,341,233 A | 8/1994 | Tomoike et al. |
| 5,406,425 A | 4/1995 | Johnston et al. |
| 5,424,245 A | 6/1995 | Gurtler et al. |
| 5,459,463 A | 10/1995 | Gruaz et al. |
| 5,463,388 A | 10/1995 | Boie et al. |
| 5,650,597 A | 7/1997 | Redmayne |
| 5,657,012 A | 8/1997 | Tait |
| 5,777,596 A | 7/1998 | Herbert |
| 5,796,183 A | 8/1998 | Hourmand |
| 5,841,078 A | 11/1998 | Miller et al. |
| 5,869,790 A | 2/1999 | Shigetaka et al. |
| 5,914,465 A | 6/1999 | Allen et al. |
| 6,054,979 A | 4/2000 | Sellers |
| 6,168,969 B1 | 1/2001 | Farnworth |
| 6,188,391 B1 | 2/2001 | Seely et al. |
| 6,222,522 B1 | 4/2001 | Mathews et al. |
| 6,256,022 B1 | 7/2001 | Manaresi et al. |
| 6,281,888 B1 | 8/2001 | Hoffman et al. |
| 6,288,707 B1 | 9/2001 | Philipp |
| 6,297,811 B1 | 10/2001 | Kent et al. |
| 6,307,751 B1 | 10/2001 | Bodony et al. |
| 6,320,394 B1 | 11/2001 | Tartagni |
| 6,362,633 B1 | 3/2002 | Tartagni |
| 6,380,930 B1 | 4/2002 | Van Ruymbeke |
| 6,452,514 B1 | 9/2002 | Philipp |
| 6,459,044 B2 | 10/2002 | Watanabe et al. |
| 6,486,862 B1 | 11/2002 | Jacobsen et al. |
| 6,512,381 B2 | 1/2003 | Kramer |
| 6,535,200 B2 | 3/2003 | Philipp |
| 6,583,632 B2 | 6/2003 | Von Basse et al. |
| 6,653,736 B2 | 11/2003 | Kishimoto et al. |
| 6,731,120 B2 | 5/2004 | Tartagni |
| 6,771,327 B2 | 8/2004 | Sekiguchi |
| 6,800,930 B2 | 10/2004 | Jackson et al. |
| 6,825,833 B2 | 11/2004 | Mulligan et al. |
| 6,879,930 B2 | 4/2005 | Sinclair et al. |
| 6,892,302 B2 | 5/2005 | Wheeler et al. |
| 6,910,634 B1 | 6/2005 | Inose et al. |
| 6,937,031 B2 | 8/2005 | Yoshioka et al. |
| 6,998,855 B2 | 2/2006 | Tartagni |
| 7,129,935 B2 | 10/2006 | Mackey |
| 7,158,125 B2 | 1/2007 | Sinclair et al. |
| 7,207,060 B2 | 4/2007 | Immonen et al. |
| 7,218,314 B2 | 5/2007 | Itoh |
| 7,306,144 B2 | 12/2007 | Moore |
| 7,327,352 B2 | 2/2008 | Keefer et al. |
| 7,339,579 B2 | 3/2008 | Richter et al. |
| 7,348,967 B2 | 3/2008 | Zadesky et al. |
| 7,382,139 B2 | 6/2008 | Mackey |
| 7,388,571 B2 | 6/2008 | Lowles et al. |
| 7,423,219 B2 | 9/2008 | Kawaguchi et al. |
| 7,423,635 B2 | 9/2008 | Taylor et al. |
| 7,439,962 B2 | 10/2008 | Reynolds et al. |
| 7,455,529 B2 | 11/2008 | Fujii et al. |
| 7,522,230 B2 | 4/2009 | Lee |
| 7,548,073 B2 | 6/2009 | Mackey et al. |
| 7,554,531 B2 | 6/2009 | Baker et al. |
| 7,589,713 B2 | 9/2009 | Sato |
| 7,663,607 B2 | 2/2010 | Hotelling et al. |
| 7,683,459 B2 | 3/2010 | Ma et al. |
| 7,724,243 B2 | 5/2010 | Geaghan |
| 7,768,273 B1 | 8/2010 | Kalnitsky et al. |
| 7,786,981 B2 | 8/2010 | Proctor |
| 7,808,255 B2 | 10/2010 | Hristov et al. |
| 7,812,825 B2 | 10/2010 | Sinclair et al. |
| 7,821,274 B2 | 10/2010 | Philipp et al. |
| 7,821,502 B2 | 10/2010 | Hristov |
| 7,859,521 B2 | 12/2010 | Hotelling et al. |
| 7,864,160 B2 | 1/2011 | Geaghan et al. |
| 7,868,874 B2 | 1/2011 | Reynolds |
| 7,876,309 B2 | 1/2011 | XiaoPing |
| 7,973,771 B2 | 7/2011 | Geaghan |
| 7,977,953 B2 | 7/2011 | Lee |
| 7,986,152 B2 | 7/2011 | Philipp et al. |
| 8,040,326 B2 | 10/2011 | Hotelling et al. |
| 8,059,015 B2 | 11/2011 | Hua et al. |
| 8,125,463 B2 | 2/2012 | Hotelling et al. |
| 8,154,533 B2 | 4/2012 | Jung et al. |
| 8,169,568 B2 | 5/2012 | Kim |
| 8,243,027 B2 | 8/2012 | Hotelling et al. |
| 8,258,986 B2 | 9/2012 | Makovetskyy |
| 8,259,078 B2 | 9/2012 | Hotelling et al. |
| 8,278,571 B2 | 10/2012 | Orsley |
| 8,305,359 B2 | 11/2012 | Bolender et al. |
| 8,319,325 B2 | 11/2012 | Henderson et al. |
| 8,319,747 B2 | 11/2012 | Hotelling et al. |
| 8,368,657 B2 | 2/2013 | Borras |
| 8,486,805 B2 | 7/2013 | Zhao et al. |
| 8,766,409 B2 | 7/2014 | Yu |
| 8,970,537 B1 | 3/2015 | Shepelev et al. |
| 9,041,636 B2 | 5/2015 | Fujioka et al. |
| 9,087,491 B2 | 7/2015 | Nakanishi et al. |
| 9,329,721 B1 | 5/2016 | Buuck et al. |
| 2002/0077313 A1 | 6/2002 | Clayman |
| 2003/0052867 A1 | 3/2003 | Shigetaka et al. |
| 2003/0103043 A1 | 6/2003 | Mulligan et al. |
| 2003/0115466 A1 | 6/2003 | Aull et al. |
| 2003/0234771 A1 | 12/2003 | Mulligan et al. |
| 2004/0062012 A1 | 4/2004 | Murohara |
| 2004/0077313 A1 | 4/2004 | Oba et al. |
| 2004/0125087 A1 | 7/2004 | Taylor et al. |
| 2004/0222974 A1 | 11/2004 | Hong et al. |
| 2004/0239650 A1 | 12/2004 | Mackey |
| 2004/0252109 A1 | 12/2004 | Trent et al. |
| 2005/0030048 A1 | 2/2005 | Bolender et al. |
| 2006/0038754 A1 | 2/2006 | Kim |
| 2006/0097991 A1 | 5/2006 | Hotelling et al. |
| 2006/0114240 A1 | 6/2006 | Lin |
| 2006/0114241 A1 | 6/2006 | Lin |
| 2006/0232600 A1 | 10/2006 | Kimura et al. |
| 2007/0008299 A1 | 1/2007 | Hristov |
| 2007/0222762 A1 | 9/2007 | Van Delden et al. |
| 2007/0229466 A1 | 10/2007 | Peng et al. |
| 2007/0229468 A1 | 10/2007 | Peng et al. |
| 2007/0229469 A1 | 10/2007 | Seguine |
| 2007/0229470 A1 | 10/2007 | Snyder et al. |
| 2007/0242054 A1 | 10/2007 | Chang et al. |
| 2007/0257894 A1 | 11/2007 | Philipp |
| 2007/0262962 A1 | 11/2007 | XiaoPing et al. |
| 2007/0262963 A1 | 11/2007 | Xiao-Ping et al. |
| 2007/0268265 A1 | 11/2007 | XiaoPing |
| 2007/0273659 A1 | 11/2007 | XiaoPing et al. |
| 2007/0273660 A1 | 11/2007 | XiaoPing |
| 2007/0279395 A1 | 12/2007 | Philipp et al. |
| 2007/0291009 A1 | 12/2007 | Wright et al. |
| 2008/0006453 A1 | 1/2008 | Hotelling |
| 2008/0007534 A1 | 1/2008 | Peng et al. |
| 2008/0062140 A1 | 3/2008 | Hotelling et al. |
| 2008/0062147 A1 | 3/2008 | Hotelling et al. |
| 2008/0074398 A1 | 3/2008 | Wright |
| 2008/0111795 A1 | 5/2008 | Bollinger |
| 2008/0117182 A1 | 5/2008 | Um et al. |
| 2008/0150906 A1 | 6/2008 | Grivna |
| 2008/0157782 A1 | 7/2008 | Krah |
| 2008/0158167 A1 | 7/2008 | Hotelling et al. |
| 2008/0158172 A1 | 7/2008 | Hotelling et al. |
| 2008/0158181 A1 | 7/2008 | Hamblin et al. |
| 2008/0158183 A1 | 7/2008 | Hotelling et al. |
| 2008/0164076 A1 | 7/2008 | Orsley |
| 2008/0218488 A1 | 9/2008 | Yang et al. |

(56) References Cited

U.S. PATENT DOCUMENTS

| | | |
|---|---|---|
| 2008/0245582 A1 | 10/2008 | Bytheway |
| 2008/0246723 A1 | 10/2008 | Baumbach |
| 2008/0259044 A1 | 10/2008 | Utsunomiya et al. |
| 2008/0264699 A1 | 10/2008 | Chang et al. |
| 2008/0265914 A1 | 10/2008 | Matsushima |
| 2008/0297176 A1 | 12/2008 | Douglas |
| 2008/0308323 A1 | 12/2008 | Huang et al. |
| 2008/0309635 A1 | 12/2008 | Matsuo |
| 2009/0002337 A1 | 1/2009 | Chang |
| 2009/0002338 A1 | 1/2009 | Kinoshita et al. |
| 2009/0040191 A1 | 2/2009 | Tong et al. |
| 2009/0046077 A1 | 2/2009 | Tanaka et al. |
| 2009/0091551 A1 | 4/2009 | Hotelling et al. |
| 2009/0096757 A1 | 4/2009 | Hotelling et al. |
| 2009/0107737 A1 | 4/2009 | Reynolds et al. |
| 2009/0128518 A1 | 5/2009 | Kinoshita et al. |
| 2009/0135151 A1 | 5/2009 | Sun |
| 2009/0153509 A1 | 6/2009 | Jiang et al. |
| 2009/0160682 A1 | 6/2009 | Bolender et al. |
| 2009/0185100 A1 | 7/2009 | Matsuhira et al. |
| 2009/0194344 A1 | 8/2009 | Harley et al. |
| 2009/0201267 A1 | 8/2009 | Akimoto et al. |
| 2009/0207154 A1 | 8/2009 | Chino |
| 2009/0213082 A1 | 8/2009 | Ku |
| 2009/0213534 A1 | 8/2009 | Sakai |
| 2009/0236151 A1 | 9/2009 | Yeh et al. |
| 2009/0262096 A1 | 10/2009 | Teramoto |
| 2009/0267916 A1 | 10/2009 | Hotelling |
| 2009/0273571 A1 | 11/2009 | Bowens |
| 2009/0273573 A1 | 11/2009 | Hotelling |
| 2009/0277695 A1 | 11/2009 | Liu et al. |
| 2009/0283340 A1 | 11/2009 | Liu et al. |
| 2009/0284495 A1 | 11/2009 | Geaghan et al. |
| 2009/0303203 A1 | 12/2009 | Yilmaz et al. |
| 2009/0309850 A1 | 12/2009 | Yang |
| 2009/0314621 A1 | 12/2009 | Hotelling |
| 2009/0322702 A1 | 12/2009 | Chien et al. |
| 2009/0324621 A1 | 12/2009 | Senter et al. |
| 2010/0001966 A1 | 1/2010 | Lii et al. |
| 2010/0001973 A1 | 1/2010 | Hotelling et al. |
| 2010/0006347 A1 | 1/2010 | Yang |
| 2010/0013745 A1 | 1/2010 | Kim et al. |
| 2010/0013800 A1 | 1/2010 | Elias et al. |
| 2010/0044122 A1 | 2/2010 | Sleeman et al. |
| 2010/0060608 A1 | 3/2010 | Yousefpor |
| 2010/0090979 A1 | 4/2010 | Bae |
| 2010/0134422 A1 | 6/2010 | Borras |
| 2010/0140359 A1 | 6/2010 | Hamm et al. |
| 2010/0144391 A1 | 6/2010 | Chang et al. |
| 2010/0147600 A1 | 6/2010 | Orsley |
| 2010/0149108 A1 | 6/2010 | Hotelling et al. |
| 2010/0156839 A1 | 6/2010 | Ellis |
| 2010/0163394 A1 | 7/2010 | Tang et al. |
| 2010/0164889 A1 | 7/2010 | Hristov et al. |
| 2010/0182273 A1 | 7/2010 | Noguchi et al. |
| 2010/0188359 A1 | 7/2010 | Lee |
| 2010/0193257 A1 | 8/2010 | Hotelling et al. |
| 2010/0194695 A1 | 8/2010 | Hotelling et al. |
| 2010/0194697 A1 | 8/2010 | Hotelling et al. |
| 2010/0214247 A1 | 8/2010 | Tang et al. |
| 2010/0220075 A1 | 9/2010 | Kuo et al. |
| 2010/0230818 A1 | 9/2010 | Birner et al. |
| 2010/0238134 A1 | 9/2010 | Day et al. |
| 2010/0245286 A1 | 9/2010 | Parker |
| 2010/0258360 A1 | 10/2010 | Yilmaz |
| 2010/0265210 A1 | 10/2010 | Nakanishi et al. |
| 2010/0271330 A1 | 10/2010 | Philipp |
| 2010/0277433 A1 | 11/2010 | Lee et al. |
| 2010/0289770 A1 | 11/2010 | Lee et al. |
| 2010/0291973 A1 | 11/2010 | Nakahara et al. |
| 2010/0292945 A1 | 11/2010 | Reynolds et al. |
| 2010/0302201 A1 | 12/2010 | Ritter et al. |
| 2010/0321043 A1 | 12/2010 | Philipp et al. |
| 2010/0321326 A1 | 12/2010 | Grunthaner et al. |
| 2011/0006832 A1 | 1/2011 | Land et al. |
| 2011/0006999 A1 | 1/2011 | Chang et al. |
| 2011/0007030 A1 | 1/2011 | Mo et al. |
| 2011/0018841 A1 | 1/2011 | Hristov |
| 2011/0022351 A1 | 1/2011 | Philipp et al. |
| 2011/0025629 A1 | 2/2011 | Grivna et al. |
| 2011/0025635 A1 | 2/2011 | Lee |
| 2011/0025639 A1 | 2/2011 | Trend et al. |
| 2011/0032193 A1 | 2/2011 | Szalkowski |
| 2011/0048812 A1 | 3/2011 | Yilmaz |
| 2011/0048813 A1 | 3/2011 | Yilmaz |
| 2011/0057887 A1 | 3/2011 | Lin et al. |
| 2011/0061949 A1 | 3/2011 | Krah et al. |
| 2011/0062969 A1 | 3/2011 | Hargreaves et al. |
| 2011/0062971 A1 | 3/2011 | Badaye |
| 2011/0063251 A1 | 3/2011 | Geaghan et al. |
| 2011/0080357 A1 | 4/2011 | Park et al. |
| 2011/0090159 A1 | 4/2011 | Kurashima |
| 2011/0096016 A1 | 4/2011 | Yilmaz |
| 2011/0109579 A1 | 5/2011 | Wang et al. |
| 2011/0109590 A1 | 5/2011 | Park |
| 2011/0121939 A1 | 5/2011 | Hosomi |
| 2011/0141051 A1 | 6/2011 | Ryu |
| 2011/0169770 A1 | 7/2011 | Mishina et al. |
| 2011/0173684 A1 | 7/2011 | Hurry et al. |
| 2011/0187666 A1 | 8/2011 | Min |
| 2011/0242444 A1 | 10/2011 | Song |
| 2011/0248949 A1 | 10/2011 | Chang et al. |
| 2011/0267300 A1 | 11/2011 | Serban et al. |
| 2011/0267305 A1 | 11/2011 | Shahparnia et al. |
| 2011/0273391 A1 | 11/2011 | Bae |
| 2011/0279400 A1 | 11/2011 | Yilmaz |
| 2011/0298746 A1 | 12/2011 | Hotelling |
| 2011/0304571 A1 | 12/2011 | Kim et al. |
| 2012/0038585 A1 | 2/2012 | Kim |
| 2012/0043971 A1 | 2/2012 | Maharyta |
| 2012/0044167 A1 | 2/2012 | Nakanishi et al. |
| 2012/0044171 A1 | 2/2012 | Lee et al. |
| 2012/0056820 A1 | 3/2012 | Corbridge |
| 2012/0056835 A1 | 3/2012 | Choo et al. |
| 2012/0081335 A1 | 4/2012 | Land et al. |
| 2012/0113027 A1 | 5/2012 | Song et al. |
| 2012/0206403 A1 | 8/2012 | Wang et al. |
| 2012/0218199 A1 | 8/2012 | Kim et al. |
| 2012/0313901 A1 | 12/2012 | Monson |
| 2013/0016061 A1 | 1/2013 | Souchkov |
| 2013/0033450 A1 | 2/2013 | Coulson et al. |
| 2013/0038565 A1 | 2/2013 | Elloway et al. |
| 2013/0057507 A1 | 3/2013 | Shin et al. |
| 2013/0063375 A1 | 3/2013 | Yoshida et al. |
| 2013/0088372 A1 | 4/2013 | Lundstrum et al. |
| 2013/0162570 A1 | 6/2013 | Shin et al. |
| 2013/0173211 A1 | 7/2013 | Hoch et al. |
| 2013/0176273 A1 | 7/2013 | Li et al. |
| 2013/0194223 A1 | 8/2013 | Ward et al. |
| 2013/0215075 A1* | 8/2013 | Lee .................... G06F 3/044 345/174 |
| 2013/0229382 A1 | 9/2013 | Huang et al. |
| 2013/0270702 A1 | 10/2013 | Yu et al. |
| 2013/0293515 A1 | 11/2013 | Fujioka et al. |
| 2013/0321296 A1 | 12/2013 | Lee et al. |
| 2013/0328796 A1 | 12/2013 | Al-Dahle et al. |
| 2013/0342770 A1 | 12/2013 | Kim et al. |
| 2014/0098057 A1 | 4/2014 | Lee et al. |
| 2014/0118277 A1* | 5/2014 | Kim .................... G06F 3/044 345/173 |
| 2014/0152621 A1 | 6/2014 | Okayama et al. |
| 2014/0168137 A1 | 6/2014 | Pyo et al. |
| 2014/0217590 A1 | 8/2014 | Nalla et al. |
| 2014/0292718 A1 | 10/2014 | Noguchi et al. |
| 2014/0313164 A1 | 10/2014 | Pi |
| 2014/0327644 A1 | 11/2014 | Mohindra |
| 2014/0333563 A1 | 11/2014 | Saitoh et al. |
| 2015/0002446 A1 | 1/2015 | Ayzenberg |
| 2015/0002449 A1 | 1/2015 | Lewis et al. |
| 2015/0002462 A1 | 1/2015 | Zhao et al. |
| 2015/0035783 A1 | 2/2015 | Brillant et al. |
| 2015/0042599 A1 | 2/2015 | Lukanc et al. |
| 2015/0062059 A1 | 3/2015 | Ho et al. |

(56) References Cited

U.S. PATENT DOCUMENTS

| | | |
|---|---|---|
| 2015/0084888 A1 | 3/2015 | Han et al. |
| 2015/0268784 A1 | 9/2015 | Kallassi et al. |
| 2016/0320882 A1* | 11/2016 | Kim .................. G06F 3/044 |

FOREIGN PATENT DOCUMENTS

| | | |
|---|---|---|
| EP | 0810540 A2 | 12/1997 |
| EP | 0919945 A2 | 6/1999 |
| EP | 0977159 A1 | 2/2000 |
| JP | 2002-215330 A | 8/2002 |
| JP | 2002-268768 A | 9/2002 |
| JP | 2002268786 A | 9/2002 |
| JP | 2008015755 A | 1/2008 |
| JP | 2011002947 A | 1/2011 |
| JP | 2011002948 A | 1/2011 |
| JP | 2011002949 A | 1/2011 |
| JP | 2011002950 A | 1/2011 |
| JP | 2011004076 A | 1/2011 |
| JP | 2011100379 A | 5/2011 |
| KR | 10110118065 | 1/2012 |
| WO | WO-86/06551 A1 | 11/1986 |
| WO | WO-0057344 A1 | 9/2000 |
| WO | WO-2010117946 A2 | 10/2010 |
| WO | WO-20100136932 A1 | 12/2010 |

OTHER PUBLICATIONS

Ken Gilleo. "The Circuit Centennial", Apr. 28, 2003, Total of 7 pages.

Ken Gilleo, "The Definitive History of the Printed Circuit", 1999 PC Fab.

Hal Philipp. "Charge Transfer Sensing", vol. 19, No. 2. 1999. pp. 96-105.

Paul Leopardi, "A Partition of the Unit Sphere into Regions of Equal Area and Small Diameter", 2005.

Olivier Bau, "TeslaTouch: Electrovibration for Touch Surfaces", 2010.

Colin Holland. "SID: Single Layer Technology Boosts Capacitive Touchscreens", www.eetimes.com/General. 2011.

"Novel Single Layer Touchscreen Based on Indium", 2011.

"Mesh Patterns for Capacitive Touch or Proximity Sensors", IP.com. May 14, 2010. 3pages.

"IDT Claims World's First True Single-Layer Multi-Touch Projected Capacitive Touch Screen Technology", EE Times Europe. Dec. 8, 2010.

Tracy V. Wilson et al. "How the iPhone Works", HowStuffWorks "Multi-touch Systems". 2011.

Sunkook Kim et al. "A Highly Sensitive Capacitive Touch Sensor Integrated on a Thin-Film-Encapsulated Active-Matrix OLED for Ultrathin Displays", IEEE Transactions on Electron Devices, vol. 58, No. 10, Oct. 2011.

Mike Williams, "Dream Screens from Graphene", Technology Developed at Rice could Revolutionize Touch-Screen Displays. Aug. 2011.

ASIC Packaging Guidebook, Toshiba Corporation. (2000). 35 pages.

Fujitsu Microelectronics Limited. "IC Package." (2002). 10 pages.

Quantum Research Application Note An -KD01. "Qmatrix Panel Design Guidelines", Oct. 10, 2002. 4 Pages.

Quantum Research Group. "Qmatrix Technology White Paper", 2006. 4 Pages.

Lubart, et al. "One Layer Optically Transparent Keyboard for Input Display", IP.com. Mar. 1, 1979. 3 Pages.

Gary L. Barrett et al. "Projected Capacitive Touch Technology", "Touch Technology Information Display", www.informationaldisplay.org <http://www.informationaldisplay.org>, Mar. 2010 vol. 26 No. 3, pp. 16-21.

Quantum Research Group. "Qmatrix Panel Design Guidelines", Oct. 10, 2002. 4 Pages.

Calvin Wang et al. "Single Side All-Point-Addressable Clear Glass Substrate Sensor Design", IP.com. Apr. 2, 2009. 3 Pages.

Tsz-Kin Ho et al. "32.3: Simple Single-Layer Multi-Touch Projected Capacitive Touch Panel", SID 2009 Digest, pp. 447-450.

Johannes Schoning et al. "Multi-Touch Surfaces: A Technical Guide", Technical Report TUM-I0833. 2008.

International Search Report and Written Opinion, dated Dec. 12, 2014 PCT/US2014055934, Consists of 12 pages.

Japanese Patent Application No. P2014-529868, Office Action dated Nov. 24, 2015, 9 pages.

International Application No. PCT/US2016/066888, International Search Report and Written Opinion, dated Apr. 3, 2017, Consists of 14 pages.

* cited by examiner

ROUTING CONDUCTORS IN AN INTEGRATED DISPLAY DEVICE AND SENSING DEVICE

BACKGROUND

Field of the Disclosure

Embodiments of disclosure generally relate to capacitive sensing and, more particularly, routing conductors in an integrated display device and sensing device.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

Techniques for routing conductors in an integrated display device and sensing device are described. In an embodiment, an input device includes a capacitive sensing device integrated with a display device. The input device further includes a plurality of sensor electrodes of the capacitive sensing device, each of the plurality of sensor electrodes comprising one or more common electrodes of the display device. The input device further includes a plurality of source lines disposed at least partially in an active portion of the display device. The input device further includes a plurality of routing traces. The plurality of routing traces includes a first routing trace, at least a first portion of the first routing trace being disposed in a first metal layer, parallel to a first source line of the plurality of source lines and in the active portion of the display device. The plurality of routing traces further includes a second routing trace, a first portion of the second routing trace disposed parallel to the first routing trace in the first metal layer and in the active portion of the display, a second portion of the second routing trace disposed in a second metal layer in an inactive portion of the display device and crossing the first routing trace, the second routing trace coupled to a first sensor electrode of the plurality of sensor electrodes through a first via.

In another embodiment, a display device includes an active portion having a plurality of display electrodes, an inactive portion, a plurality of source lines disposed at least partially in the active portion, and a plurality of routing traces. The plurality of routing traces includes a first routing trace, at least a first portion of the first routing trace being disposed in a first metal layer, parallel to a first source line of the plurality of source lines and in the active portion. The plurality of routing traces further includes a second routing trace, a first portion of the second routing trace disposed parallel to the first routing trace in the first metal layer and in the active portion, a second portion of the second routing trace disposed in a second metal layer in the inactive portion and crossing the first routing trace, the second routing trace coupled to a first display electrode of the plurality of display electrodes through a first via.

In another embodiment, a processing system for a capacitive sensing device and display device includes source drivers configured for driving a plurality of source lines disposed at least partially in an active portion of the display device. The processing system further includes sensor circuitry configured to be coupled to a plurality of sensor electrodes of the capacitive sensing device through a plurality of routing traces, each of the plurality of sensor electrodes comprising one or more common electrodes of the display device. The plurality of routing traces includes a first routing trace, at least a first portion of the first routing trace being disposed in a first metal layer, parallel to a first source line of the plurality of source lines and in the active portion of the display device. The plurality of routing traces further includes a second routing trace, a first portion of the second routing trace disposed parallel to the first routing trace in the first metal layer and in the active portion of the display, a second portion of the second routing trace disposed in a second metal layer in an inactive portion of the display device and crossing the first routing trace, the second routing trace coupled to a first sensor electrode of the plurality of sensor electrodes through a first via.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Figure 1:
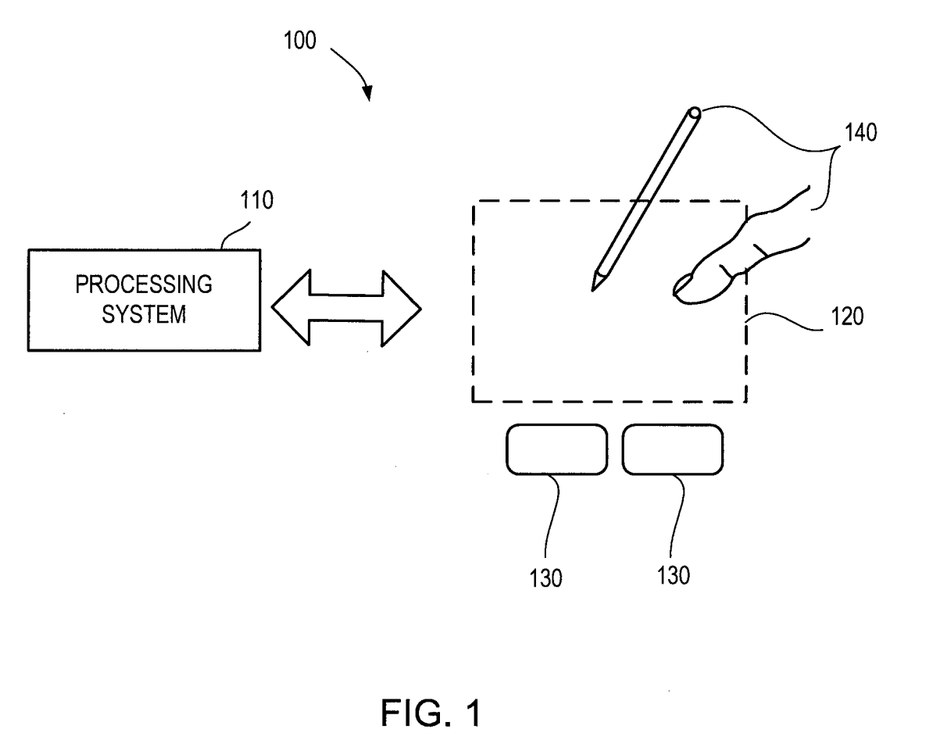
FIG. 1 is a block diagram of an exemplary input device, according to one embodiment described herein.

FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
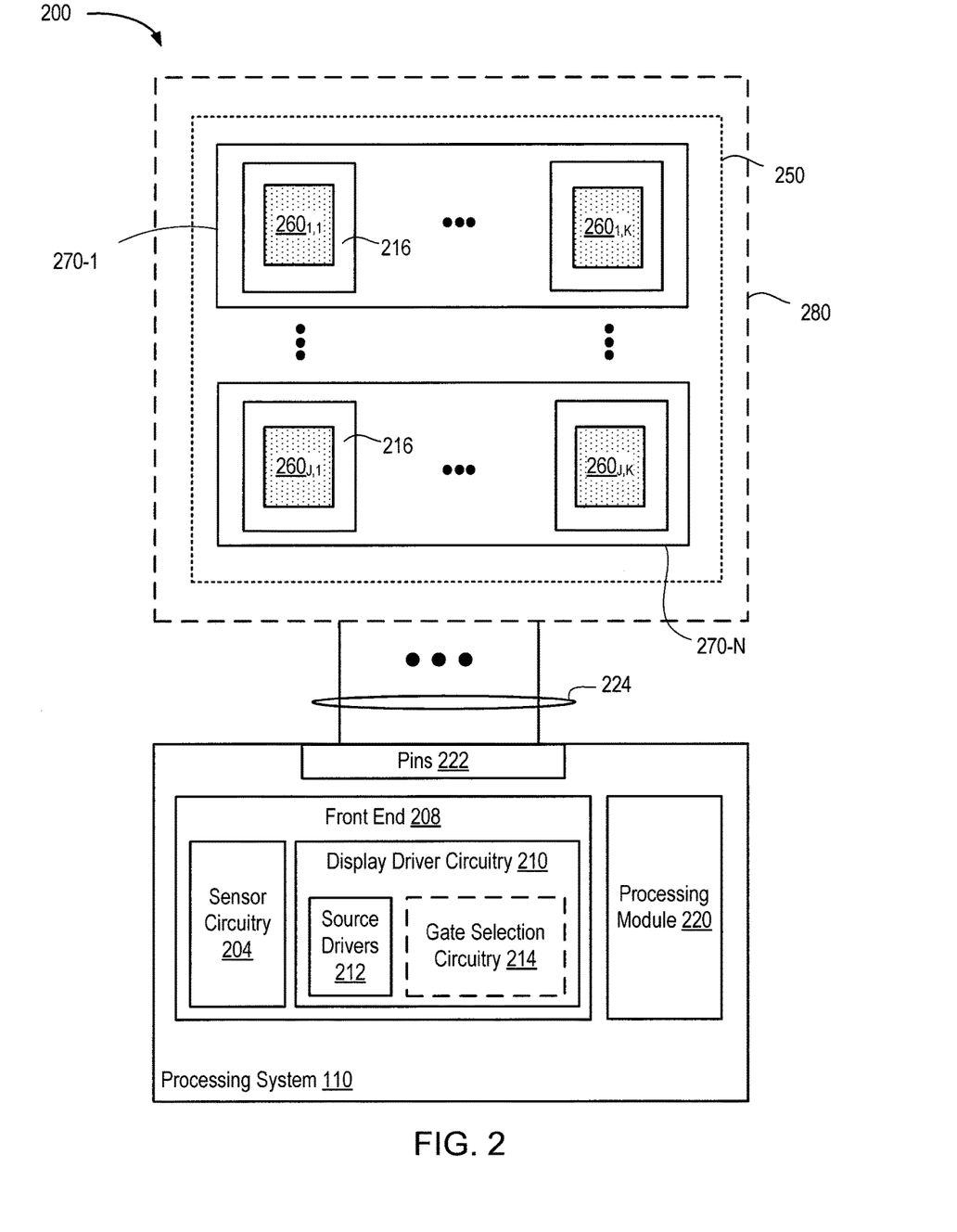
FIG. 2 is a block diagram depicting a capacitive sensing device of the input device of FIG. 1 according to some embodiments.

FIG. 2 is a block diagram depicting a capacitive sensing device 200 of the input device 100 according to some embodiments. For clarity of illustration and description, FIG. 2 shows the sensing elements of the capacitive sensing device 200 in a matrix of rectangles and does not show various components, such as various interconnects between the sensing elements and the processing system 110. An electrode pattern 250 comprises a plurality of sensor electrodes 260 disposed in a rectangular matrix with a grid electrode 270 disposed therebetween. The sensor electrodes 260 are arranged in J rows and K columns, where J and K are positive integers, although one of J and K may be zero. It is contemplated that the electrode pattern 250 may comprise other patterns of the sensor electrodes 260, such as polar arrays, repeating patterns, non-repeating patterns, non-uniform arrays a single row or column, or other suitable arrangement. Further, the sensor electrodes 260 may be any shape, such as circular, rectangular, diamond, star, square, noncovex, convex, nonconcave concave, etc. Further, the sensor electrodes 260 may be sub-divided into a plurality of distinct sub-electrodes. The grid electrode 270 include be divided into a plurality of electrodes. In the example of FIG. 2, the electrode pattern 250 includes a plurality of grid electrodes 270-1 through 270-N, where N is a positive integer. The grid electrodes 270-1 through 270-N can be electrically coupled to each other or can be electrically isolated from each other.

The sensor electrodes 260 are typically ohmically isolated from one another. Additionally, where a sensor electrode 260 includes multiple sub-electrodes, the sub-electrodes may be ohmically isolated from each other. Furthermore, in one embodiment, the sensor electrodes 260 may be ohmically isolated from the grid electrode 270 that is between the sensor electrodes 260. In one example, the grid electrode 270 may surround one or more of the sensor electrodes 260, which are disposed in windows 216 of the grid electrode 270. The grid electrode 270 may be used as a shield or to carry a guarding signal for use when performing capacitive sensing with the sensor electrodes 260. Alternatively or additionally, the grid electrode 270 may be used as sensor electrode when performing capacitive sensing. Furthermore, the grid electrode 270 may be co-planar with the sensor electrodes 260, but this is not a requirement. For instance, the grid electrode 270 may be located on a different substrate or on a different side of the same substrate as the sensor electrodes 260. The grid electrode 270 is optional and in some embodiments, the grid electrode 270 is not present. In another embodiment, the sensor electrodes 260 can overlap portions of the grid electrode 270. The portions of overlap occur in regions where the sensor electrodes 260 and the grid electrode 270 are insulated from each other (e.g., using different layers or jumpers). The sensor electrodes 260, the grid electrode 270, or both can be disposed within the sensing region 120. The electrode pattern 250 is coupled to the processing system 110 through routing traces (discussed below).

The processing system 110 can include a front end 208 having sensor circuitry 204. The sensor circuitry 204 operates the electrode pattern 250 to receive resulting signals from sensor electrodes using a capacitive sensing signal having a sensing frequency. The processing system 110 can include a processing module 220 configured to determine capacitive measurements from the resulting signals. The processing module 220 can include processor circuitry, such as a digital signal processor (DSP), microprocessor, or the like. The processing module 220 can include software and/or firmware configured for execution by processor circuitry to implement various functions, such as determining object position from the resulting signals. Alternatively, some or all of the functions of the processor module 220 can be implemented entirely in hardware (e.g., using integrated circuitry). The processing module 220 can track changes in capacitive measurements to detect input object(s) in the sensing region 120. The processing system 110 can include other modular configurations, and the functions performed by the front end 208 and the processing module 220 can, in general, be performed by one or more modules or circuits in the processing system 110. The processing system 110 can include other modules and circuits, and can perform other functions as described in some embodiments below.

The processing system 110 can operate in absolute capacitive sensing mode or transcapacitive sensing mode. In absolute capacitive sensing mode, receiver(s) in the sensor circuitry 204 measure voltage, current, or charge on sensor electrode(s) 260 in the electrode pattern 250 while the sensor electrode(s) 260 are modulated with absolute capacitive sensing signals to generate the resulting signals. The processing module 220 generates absolute capacitive measurements from the resulting signals. The processing module 220 can track changes in absolute capacitive measurements to detect input object(s) in the sensing region 120.

In transcapacitive sensing mode, some electrodes 260 can be transmitter electrodes, while other electrodes 260 can be receiver electrodes. Alternatively, the grid electrode 270 can include transmitter electrode(s) and the sensor electrodes 260 can include receiver electrodes. The sensor circuitry 204 drives one or more transmitter electrodes with the capacitive sensing signal (also referred to as a transmitter signal or modulated signal in the transcapacitive sensing mode). Receiver(s) in the sensor circuitry 204 measure voltage, current, or charge on one or more receiver electrodes to generate the resulting signals. The resulting signals comprise the effects of the capacitive sensing signal and input object(s) in the sensing region 120. The processing module 220 generates transcapacitive measurements from the resulting signals. The processing module 220 can track changes in transcapacitive measurements to detect input object(s) in the sensing region 120.

In some embodiments, the processing system 110 "scans" the electrode pattern 250 to determine capacitive measurements. In the transcapacitive sensing mode, the processing system 110 can operate the electrode pattern 250 such that one transmitter electrode transmits at one time, or multiple transmitter electrodes transmit at the same time. Where multiple transmitter electrodes transmit simultaneously, these multiple transmitter electrodes may transmit the same transmitter signal and effectively produce a larger transmitter electrode, or these multiple transmitter electrodes may transmit different transmitter signals. For example, multiple transmitter electrodes may transmit different transmitter signals according to one or more coding schemes that enable their combined effects on the resulting signals of the receiver electrodes to be independently determined. In the absolute capacitive sensing mode, the processing system 110 can receiving resulting signals from one sensor electrode 260 at a time, or from a plurality of sensor electrodes 260 at a time.

In either sensing mode, the processing system 110 can use the resulting signals to determine capacitive measurements at the capacitive pixels. A set of measurements from the capacitive pixels form a "capacitive image" (also "capacitive frame") representative of the capacitive measurements at the pixels. The processing system 110 can acquire multiple capacitive images over multiple time periods, and can determine differences between capacitive images to derive information about input in the sensing region 120. For example, the processing system 110 can use successive capacitive images acquired over successive periods of time to track the motion(s) of one or more input objects entering, exiting, and within the sensing region 120.

The baseline capacitance of the input device 100 is the capacitive image or capacitive profile associated with no input object in the sensing region 120. The baseline capacitance changes with the environment and operating conditions, and the processing system 110 can estimate the baseline capacitance in various ways. For example, in some embodiments, the processing system 110 takes "baseline images" or "baseline profiles" when no input object is determined to be in the sensing region 120, and uses those baseline images or baseline profiles as estimates of baseline capacitances. The processing module 220 can account for the baseline capacitance in the capacitive measurements and thus the capacitive measurements can be referred to as "delta capacitive measurements". Thus, the term "capacitive measurements" as used herein encompasses delta-measurements with respect to a determined baseline.

In some touch screen embodiments, at least one of the sensor electrodes 260 comprise one or more display electrodes of a display device 280 used in updating a display of a display screen, such as one or more segments of a "Vcom" electrode (common electrodes), gate electrodes, source electrodes, anode electrode and/or cathode electrode. These display electrodes may be disposed on an appropriate display screen substrate. For example, the display electrodes may be disposed on a transparent substrate (a glass substrate, TFT glass, or any other transparent material) in some display screens (e.g., In Plane Switching (IPS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. The display electrodes can also be referred to as "common electrodes," since the display electrodes perform functions of display updating and capacitive sensing. In some embodiments, at least one of the grid electrodes 270 comprises one or more common electrodes. In various embodiments, each electrode of the sensor electrodes 260 and/or grid electrode 270 comprises one or more common electrodes. In other embodiments, at least two sensor electrodes of the sensor electrodes 260 or at least two electrodes of the grid electrode 270 may share at least one common electrode. Furthermore, in one embodiment, both the sensor electrodes 260 and the grid electrode 270 are disposed within a display stack on the display screen substrate. An example display stack is described below with respect to FIG. 3. However, in other embodiments, only the sensor electrodes 260 or the grid electrode 270 (but not both) are disposed within the display stack, while other sensor electrodes are outside of the display stack (e.g., disposed on an opposite side of a color filter glass).

In an embodiment, the processing system 110 comprises a single integrated controller, such as an application specific integrated circuit (ASIC), having the front end 208, the processing module 220, and any other module(s) and/or circuit(s). In another embodiment, the processing system 110 can include a plurality of integrated circuits, where the front end 208, the processing module 220, and any other module(s) and/or circuit(s) can be divided among the integrated circuits. For example, the front end 208 can be on one integrated circuit, and the processing module 220 and any other module(s) and/circuit(s) can be one or more other integrated circuits. In some embodiments, a first portion of the front end 208 can be on one integrated circuit and a second portion of the front end 208 can be on second integrated circuit. In such embodiments, at least one of the first and second integrated circuits comprises at least portions of other modules, such as a display driver module and/or a display driver module.

Figure 3:
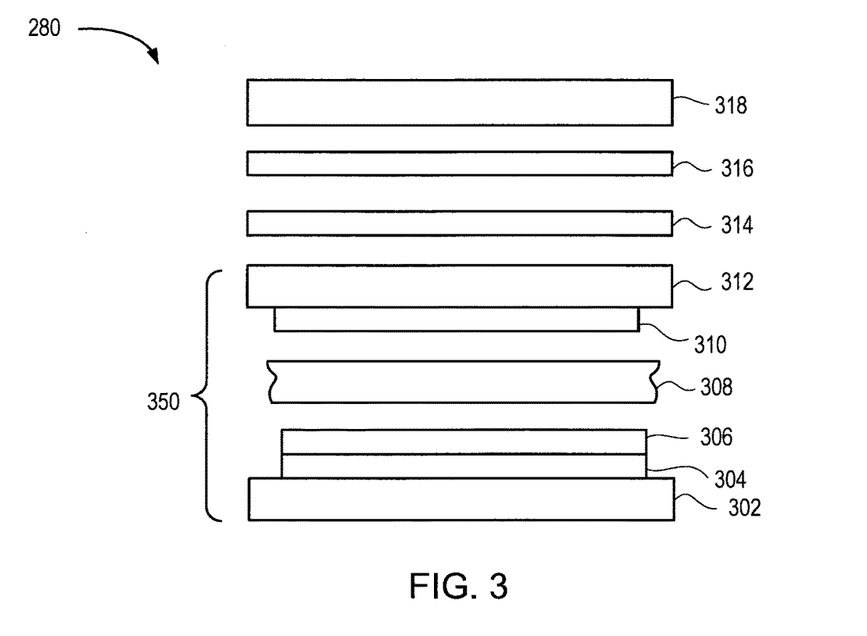
FIG. 3 is an exploded view of a display device according to an embodiment.

FIG. 3 is an exploded view of the display device 280 according to an embodiment. The capacitive sensing device 200 is integrated with the display device 280. The display device 280 generally includes a plurality of transparent substrates positioned over a first substrate, referred to herein as thin-film transistor (TFT) glass 302. An active element 304 is formed on the TFT glass 302. The active element 304 includes TFT layers (described below) that form display update circuitry configured to update a plurality of pixels. The TFT layers of the active element 304 can be electrically coupled to display electrodes, including pixel electrodes (not shown) and Vcom electrodes 306. In an embodiment, the Vcom electrodes 306 are disposed on the TFT glass 302. In the embodiment shown, the Vcom electrodes 306 are disposed on the top TFT layers of the active element 304. In some embodiments, the Vcom electrodes 306 are segmented into a plurality of common electrodes and used for both display updating and capacitive sensing. The Vcom electrodes 306 can also include electrodes that are used only for display updating.

The display device 280 includes a second substrate, referred to herein as color filter glass 312, a lens 318, an optional polarizer 316, and an optional anti-shatter film 314. A layer of display material 308 (e.g., liquid crystal) is disposed between the color filter glass 312 and the TFT glass 302. In an embodiment, layer(s) 310 between the color filter glass 312 and the display material 308 include one or more color filters and a black mask. A region between and including the color filter glass 312 and the TFT glass 302 is referred to herein as display stack 350.

In one embodiment, sensor electrodes of the capacitive sensing device 200 are disposed at least partially within the display stack 350. A first plurality of sensor electrodes (e.g., the sensor electrodes 260), which may be operated as receiver electrodes, can be disposed between the color filter glass 312 and the display material 322 (e.g., within layer(s) 310). Further, a second plurality of electrodes (e.g., the grid electrode 270 and/or sensor electrodes 260), which may be driven as transmitter electrodes, can be common electrodes of the Vcom electrodes 306. In other embodiments, a first plurality of sensor electrodes may be disposed outside of the display stack 280, such as on the color filter glass 312 outside of the display stack 280. In another embodiment, all electrodes (e.g., the sensor electrodes 260 and the grid electrode 270) are disposed within the display stack 350. In such an embodiment, a first plurality of electrodes may be operated as receiver electrodes and a second plurality of electrodes may be operated as transmitter electrodes. Further, in such embodiments, the sensor electrodes 260 may be disposed as a plurality of matrix electrodes and operated as either absolute capacitive sensing electrodes and/or as transmitter electrodes and receiver electrodes.

Figure 4:
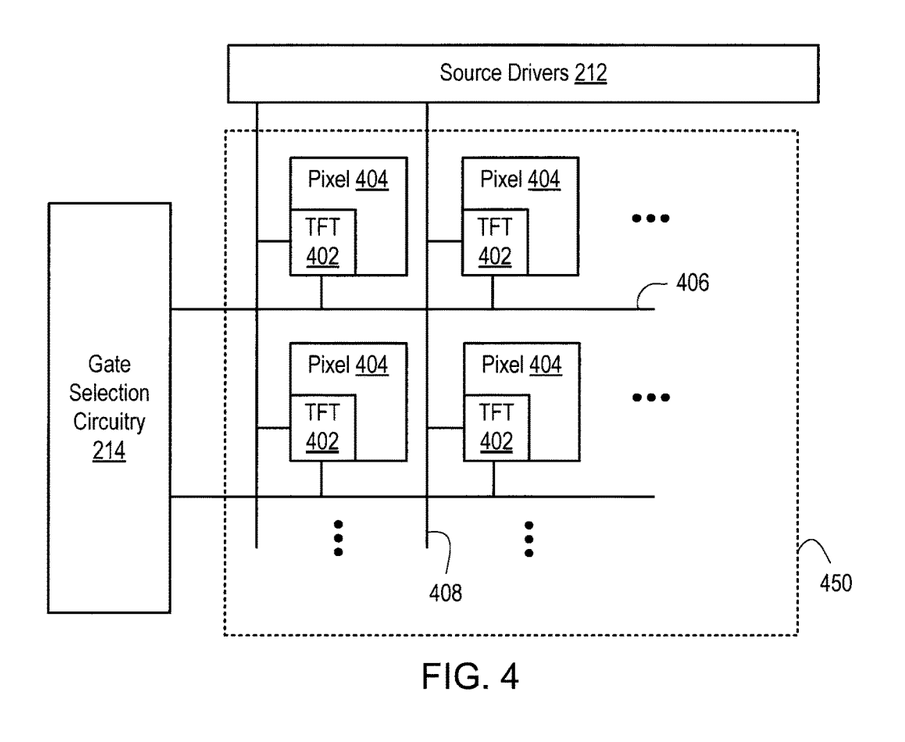
FIG. 4 is a block diagram depicting display circuitry of the display device of FIG. 3 according to an embodiment.

FIG. 4 is a block diagram depicting display circuitry 450 of the display device 280 according to an embodiment. The display circuitry 450 can be formed in the active element 304 of the display stack 350. The display circuitry 450 is coupled to source drivers 212 and gate selection circuitry 214. In an embodiment, as shown in FIG. 2, the source drivers 212 are part of display diver circuitry 210 in the front end 208 of the processing system 110. That is, the front end 208 of the processing system 110 can be configured to perform both display updating and capacitive sensing. In an embodiment, the display driver circuitry 210 can also include the gate selection circuitry 214. In other embodiments, the gate selection circuitry 214 can be located external to the processing system 110 (e.g., a gate-in-panel (GIP) type of display device).

Returning to FIG. 4, the source drivers 212 are coupled to source lines 408 of the display circuitry 450. The gate selection circuitry 214 is coupled to gate lines 406 of the display circuitry 450. The display circuitry 450 includes a plurality of pixels 404, each of which is coupled to one or more TFTs 402. A source of each TFT 402 is coupled to a respective source line. A gate of each TFT 402 is coupled to a respective gate line. A drain of each TFT 402 is coupled to a pixel electrode of a respective pixel 404. Each source line 408 drives TFTs in a column of pixels 404. Each gate line 406 drives TFTs in a row of pixels 404. The pixels 404 are used to display an image on a display screen. By coordinating the gate voltages provided by the gate selection circuitry 214 and the source voltages provided by the source drivers 212, the display driver circuitry 210 can set the pixels 404 and display an image on a display screen.

Figure 5:
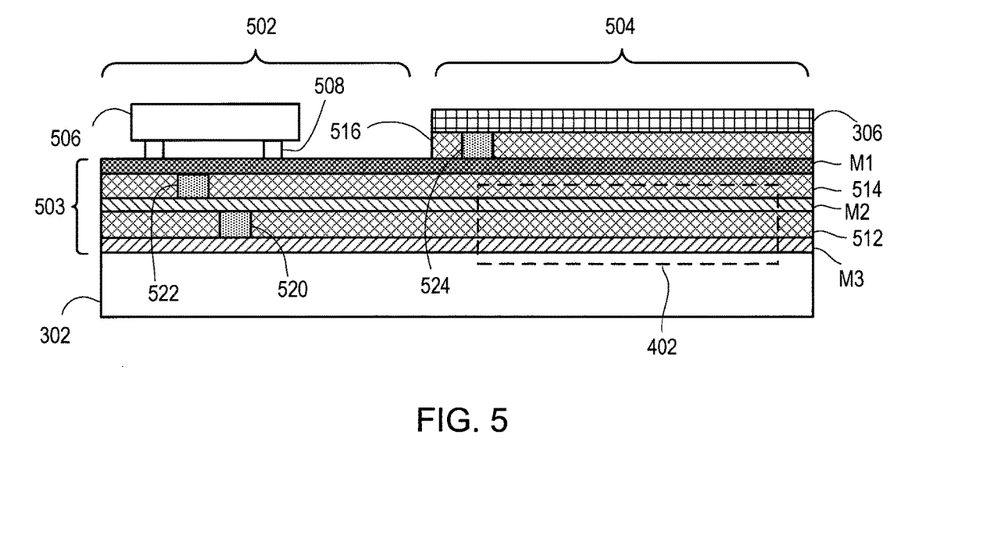
FIG. 5 is a schematic cross-section of a portion of a display stack according to an embodiment.

FIG. 5 is a schematic cross-section of a portion of the display stack 350 according to an embodiment. In the embodiment, the active element 304 on the TFT glass 320 includes a plurality of TFT layers 503. The TFT layers 503 include metal layers M1, M2, and M3, as well as layers 512 and 514. The metal layer M1 is also referred to as the "first metal layer," the metal layer M2 is also referred to as the "second metal layer," and the metal layer M3 is also referred to as the "third metal layer." The display stack 350 includes an active portion 504 and an inactive portion 502. The active portion 504 includes the display circuitry 450. The inactive portion 502 is a region on the TFT glass 302 that does not include any TFTs, pixel electrodes, display material, etc. that forms the display circuitry 450. While three metal layers are shown in the example, in other embodiments, the TFT layers 503 can include only two metal layers.

The metal layer M3 can be patterned to form gate electrodes of TFTs 402 in the active portion 504. In addition, the metal layer M3 can be patterned to form capacitor electrodes in the active portion 504 (not shown). The layer 512 can include one or more dielectric layers electrically isolating the metal layer M2 from the metal layer M3. In addition, the layer 512 can include one or more semiconductor layers disposed between the metal layer M2 and the metal layer M3 in the active portion 504. The metal layer M2 can be patterned to form source and drain electrodes of TFTs 402 in the active portion 504. The layer 514 can include one or more layers of dielectric electrically isolating the metal layer M1 from the metal layer M2. The layer 514 can also include a transparent metal layer that can be formed into pixel electrodes. The drain of each TFT 402 is coupled to a respective pixel electrode. In some two-layer embodiments, the layers M1 and M2 are replaced by a single metal layer.

The metal layer M3 can be further patterned to form the gate lines 406 electrically coupled to the gate electrodes of the TFTs 402. The metal layer M2 can be further patterned to form the source lines 408 electrically coupled to the source electrodes of the TFTs 402. The source lines 408 can be partially disposed in the active portion 504 and partially disposed in the inactive portion 502. In an embodiment, the gate lines 406 can be partially disposed in the active portion 504 and partially disposed in the inactive portion 502. In other embodiments, the gate lines 406 can be entirely disposed in the active portion 504 (e.g., GIP displays).

The metal layer M1 can be patterned to form routing traces electrically coupled to Vcom electrodes 306. In the example shown, the Vcom electrodes 306 are electrically isolated from the metal layer M1 by a dielectric layer 516. Vias 516 can be formed in the dielectric layer 516 to electrically couple particular routing traces formed in the metal layer M1 with particular Vcom electrodes 306. The routing traces can be partially disposed in the active portion 504 and partially disposed in the inactive portion 502. In an embodiment, the metal layer M1 can also be patterned to form routing traces electrically coupled to other sensor electrodes, such as receiver electrodes. For example, the receiver electrodes can be disposed between the color filter glass 312 and the display material 308. The display stack 350 can include metal pillars or the like (not shown) that electrically couple routing traces patterned on the metal layer M1 and the receiver electrodes.

An integrated circuit 506 can be electrically and mechanically coupled to the TFT layers 304 in the inactive portion 502. The integrated circuit 506 can include the processing system 110. The integrated circuit 506 includes a plurality of pins 508 that are electrically and mechanically mounted to the TFT layers 304. In the example shown, the pins 508 of the integrated circuit 506 are electrically coupled to bond pads patterned on the metal layer M1. The bond pads can be electrically coupled to routing traces patterned on the layer M1. The bond pads can also be electrically coupled to the metal layer M2, the metal layer M3, or both through vias. For example, vias 522 can be formed through layer 514 to electrically couple bond pads on the metal layer M1 with conductors patterned on the metal layer M2, such as source lines. Vias 520 can be formed through layer 512 that, when combined with conductors in the metal layer M2 and vias 522, electrically couple bond pads on the metal layer M1 with conductors patterned on the metal layer M3, such as gate lines. In various embodiments described below, the metal layers M1, M2, and M3 within the inactive area can be patterned to include conductors to electrically couple routing traces to the integrated circuit 506 using non-parallel routes. In some embodiments, vias can extend between the metal layer M3 and the metal layer M1.

Notably, the routing traces electrically coupled to the Vcom electrodes 306 are hidden by a black mask. To prevent cross-talk and local misbalance of capacitance in the active portion 504 on a common layer, the routing traces cannot cross source lines in the active portion 504. In one implementation, the routing traces can be routed around the active portion 504 within a border of the display. In other implementations, however, the display does not include such a border. As such, within the active portion 504, the routing traces must be routed parallel to the source lines and in-between the source lines. The parallel routing traces and source lines can be extended from the active portion 504 for coupling to the integrated circuit 506 disposed in the inactive portion 502. However, the integrated circuit 506 would be required to include all the pins 508 for the parallel extension of the routing traces and the source lines on one side adjacent to the active area 504. This reduces flexibility in the layout of the processing system 110 within the integrated circuit 506. For example, the sensor circuitry 204 would need to be located among the source drivers 212, rather than in a separate area of the integrated circuit 506. The parallel extension of routing traces and source lines to the integrated circuit 506 results in inefficient use of implementation area within the integrated circuit 506. Accordingly, in embodiments, the metal layers of the TFT layers 304 in the inactive portion 502 are patterned to allow for flexibility in extending the routing traces from the active portion 504 to the integrated circuit 506. The metal layers of the TFT layers 304 in the inactive portion 502 can be patterned to provide non-parallel extension of the routing traces between the active portion 504 and the integrated circuit 506, including the crossing of routing traces on different metal layers.

Figure 6:
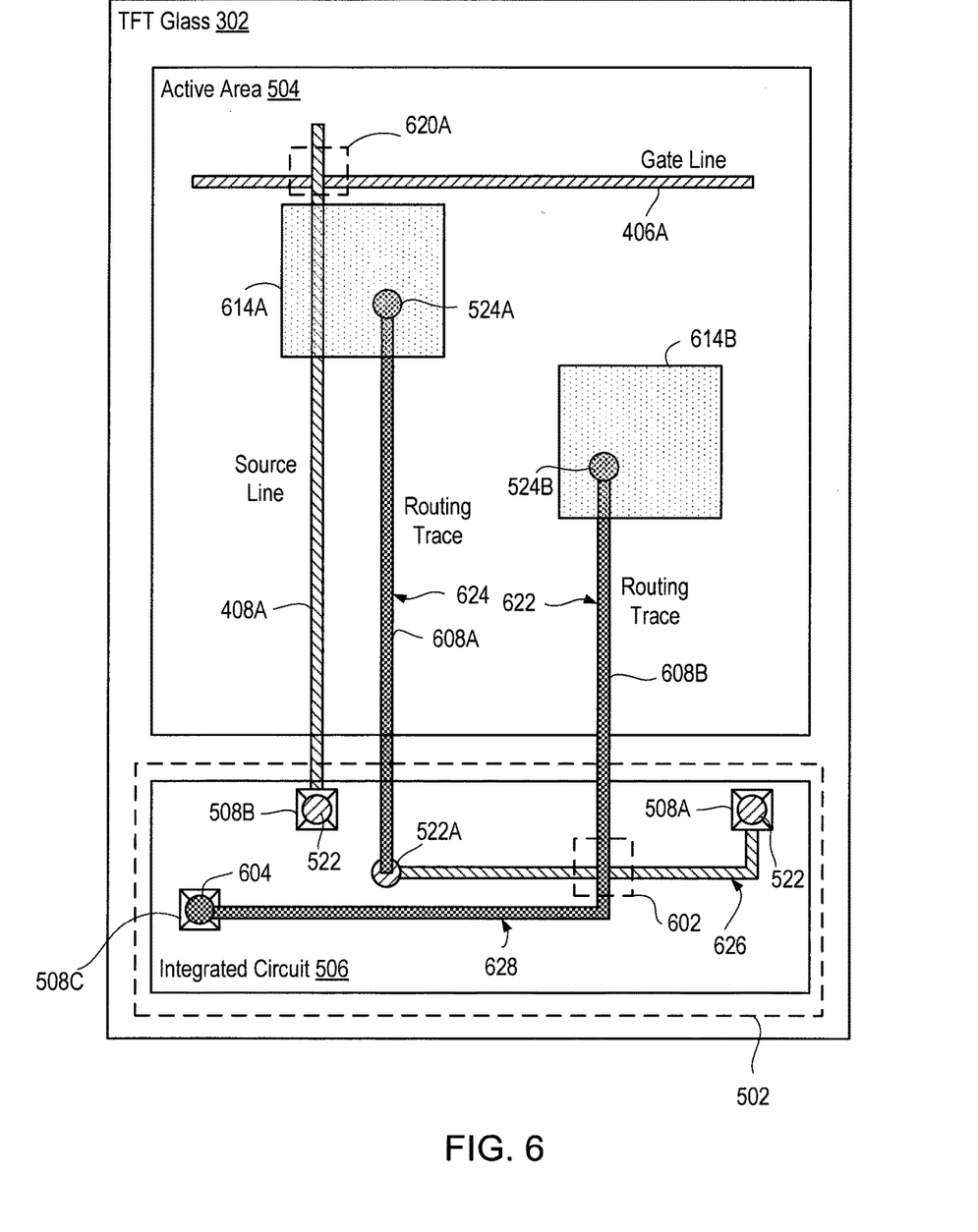
FIG. 6 is a top-view showing a portion of the display device of FIG. 3 according to an embodiment.

FIG. 6 is a top-view showing a portion of the display device 280 according to an embodiment. FIG. 6 shows a top-view of the TFT glass 302 including both the active portion 504 and the inactive portion 502. The integrated circuit 506 is mounted within the inactive portion 502. The source lines 408 are disposed at least partially in the active portion 504. In the example, a source line 408A (also referred to as a "first source line") is patterned on the metal layer M2 and extends partially in the active portion 504 and partially in the inactive portion 502. The source line 408A is electrically coupled to a pin 508B of the integrated circuit 506 through a via 522. The source line 408A is disposed perpendicular to a gate line 406A patterned on the metal layer M3. The source line 408A is coupled to a source electrode of a TFT 620A, and the gate line is coupled to a gate electrode of the TFT 620A.

A routing trace 608B (also referred to as the "first routing trace") is patterned in the metal layer M1. The routing trace 608B includes a first portion 622 disposed in the the active portion 504 parallel to the source line 408A. The first portion 622 of the routing trace 608B extends into the inactive portion 502. The routing trace 608B includes a second portion 628 disposed in the inactive portion 502 and perpendicular to the first portion 622. In the example shown, the second portion 628 of the routing ttrace 608B is disposed below the integrated circuit 506. The routing trace 608B can be coupled to a common electrode 614B of the Vcom layer 306 (also referred to as a "first sensor electrode") through a via 5246. The routing trace 608B can be coupled to a pin 508C of the integrated circuit 506 through a bond pad 604.

A routing trace 608A (also referred to as the "second routing trace") is patterned in the metal layer M1 and the metal layer M2. The routing trace 608A includes a first portion 624 disposed in the active portion 504 parallel to the first portion 622 of the routing trace 608B. The first portion 624 of the routing trace 608A extends into the inactive portion 502. The first portion 624 of the routing trace 608A is patterned in the metal layer M1. The routing trace 608A includes a second portion 626 disposed in the inactive portion 502 perpendicular to the first portion 624. The second portion 626 is patterned in the metal layer M2. The second portion 626 is electrically coupled to the first portion 624 through a via 522A. In the example shown, the second portion 626 of the routing trace 608A is disposed below the integrated circuit 506. The routing trace 608A can be coupled to a common electrode 614A of the Vcom layer 306 (also referred to as a "second sensor electrode") through a via 524A. The routing trace 608A can be coupled to a pin 508A of the integrated circuit 506 through a via 522 (and corresponding bond pad on M1). Notably, the routing trace 608B crosses the routing trace 608A within a crossing region 602. In general, one or more crossing regions 602 can be disposed in the inactive portion 502. In the example shown, the crossing region 602 is disposed beneath the integrated circuit 506.

As can be understood from the example of FIG. 6, the source lines 408 can extend parallel to each other between the active portion 504 and the inactive portion 502. The source lines 408 can be coupled to pins 508 of the integrated circuit 506 along the side of the integrated circuit 506 adjacent to the active portion 504. The source drivers 212 can be located along this same side of the integrated circuit 506. The sensor circuitry 204 can be located in other areas of the integrated circuit 506. The routing traces 608 can extend parallel to the source lines 408 within the active portion 504. Within the inactive portion 502, however, the routing traces 608 can be routed in non-parallel configurations in order to reach pins associated with the sensor circuitry 204. The non-parallel routes can be implemented using one or more layers of the TFT layers 304 within the inactive portion 502. Further, multiple metal layers of the TFT layers 304 can be used to implement crossing of routing traces on different metal layers.

The source lines 408, gate lines 406, and the routing traces 608 can be formed using different configurations of the metal layers in the TFT layers 304. In an embodiment, the source lines 408 can be disposed on the metal layer M1, rather than the metal layer M2 as described in the example above. In an embodiment, the source lines 408 can be disposed on the metal layer M3. In an embodiment, the gate lines 406 can be disposed on the metal layer M2, rather than the metal layer M3 as described in the example above. If the gate lines 406 are disposed on the metal layer M2, then the source lines can be disposed on either the metal layer M1 or the metal layer M3. In an embodiment, the gate lines 406 are disposed on the metal layer M3 as described in the example above. The source lines 408 can then be disposed on either the metal layer M1 or the metal layer M2.

In the embodiment shown in FIG. 6, one routing trace 608A includes portions on the metal layer M1 and the metal layer M2, while another routing trace 608B includes portions on the metal layer M1. Other configurations are possible. In an embodiment, a routing trace 608 can include a portion on the metal layer M1, another portion on the metal layer M2, and another portion on the metal layer M3. Vias can electrically couple portions of routing traces on the layer M3 with portions of the routing traces on the layer M2.

Figure 7:
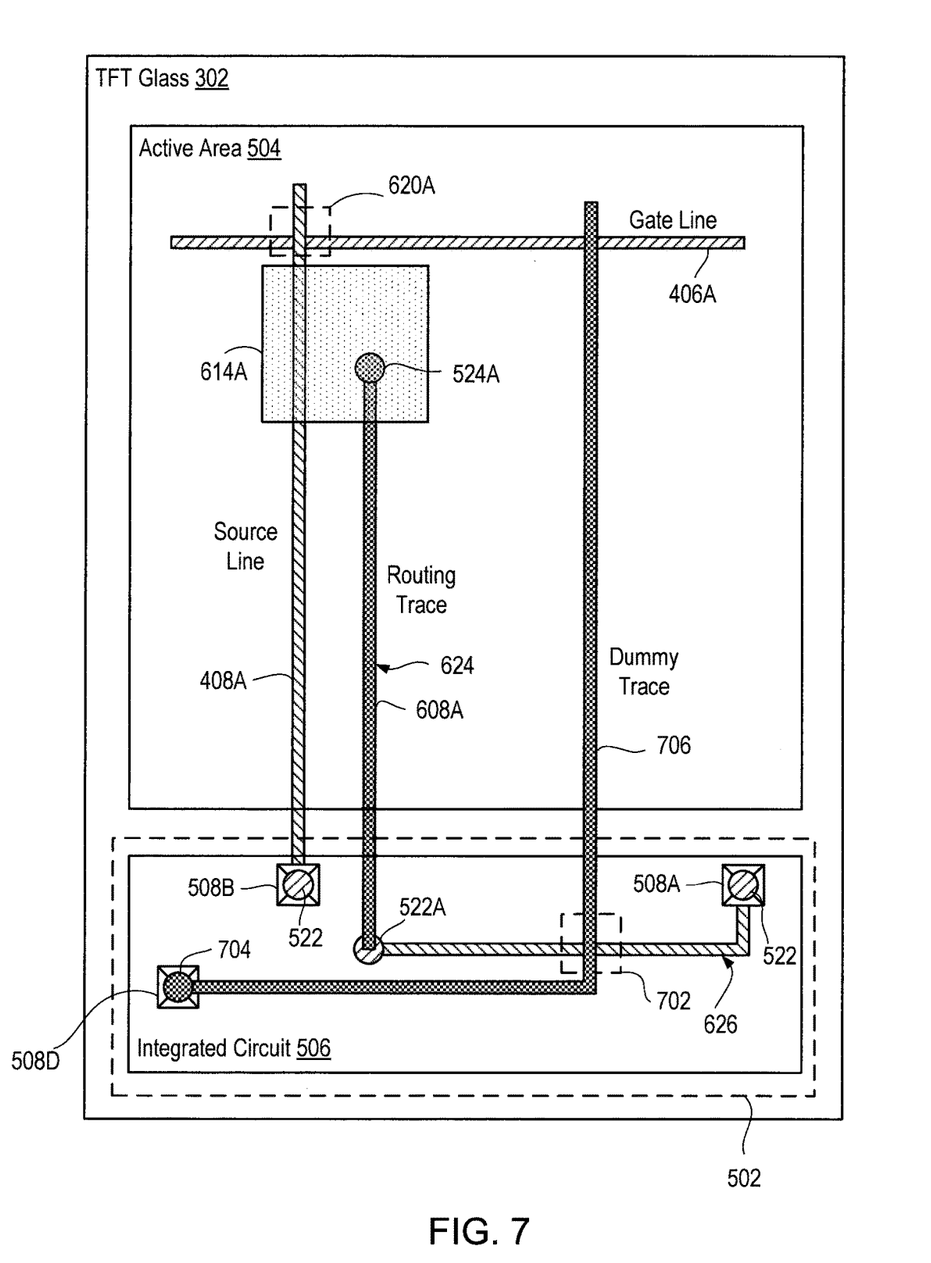
FIG. 7 is a top-view showing a portion of the display device of FIG. 3 according to another embodiment.

FIG. 7 is a top-view showing a portion of the display device 280 according to another embodiment. Elements of FIG. 7 that are the same or similar to those of FIG. 6 are described in detail above. In some embodiments, the metal layer M1 is patterned to include "dummy" traces. The dummy traces are not used for routing signals to electrodes. To avoid charge build-up and display artifacts, the dummy traces cannot be left electrically floating. To prevent display artifacts, the dummy traces can be actively driven to Vcom during display and with a guard signal during capacitive sensing. In order to receive the guard signal, the dummy traces can be electrically coupled to the integrated circuit 506. The dummy traces have the same limitation as the routing traces coupled to the Vcom electrodes. That is, the dummy traces cannot cross the source lines on a common layer within the active portion 504.

In the embodiment of FIG. 7, a dummy trace 706 is disposed on the metal layer M1. Although only one dummy trace 706 is shown, the display stack 350 can include a plurality of dummy traces 706. The dummy trace 706 includes a first portion in the active area 504 parallel to the source line 408A. The dummy trace 706 includes a second portion in the inactive area 502 perpendicular to the first portion. The dummy trace 706 is electrically coupled to a pin 508D of the integrated circuit 506 through a bond pad 704. The dummy trace 706 crosses the second portion 626 of the routing trace 608A in a crossing region 702. In the embodiment shown, the cross region 702 is beneath the integrated circuit 506.

In the example shown, the dummy trace 706 includes portions disposed on the layer M1. In other examples, the dummy trace 706 can include a portion disposed on the layer M1 in the active portion 504 and another portion disposed on the layer M2 within the inactive portion 502. In another example, the dummy trace 706 can include a portion disposed on the layer M1 in the active portion 504, another portion disposed on the layer M2 within the inactive portion 502, and another portion disposed on the layer M3 in the inactive portion 502. In general, the dummy traces 706 can be routed similarly to the routing traces 608. The processing system 110 of the integrated circuit 506 can drive the dummy traces 706 with a guard signal during capacitive sensing, and can drive the dummy traces 706 with Vcom during display updating.

The embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

I claim:

1. An input device including a capacitive sensing device integrated with a display device, the input device comprising:
    a substrate;
    a plurality of sensor electrodes of the capacitive sensing device, each of the plurality of sensor electrodes comprising one or more common electrodes of the display device;
    a plurality of source lines disposed at least partially in an active portion of the display device; and
    a plurality of routing traces, each of the plurality of routing traces uniquely couples a respective one of the plurality of sensor electrodes with a respective bond pad of a plurality of bond pads, wherein the plurality of routing traces includes:
        a first routing trace, at least a first portion of the first routing trace being disposed in a first metal layer of the substrate, parallel to a first source line of the plurality of source lines and in the active portion of the display device; and
        a second routing trace, a first portion of the second routing trace disposed parallel to the first routing trace in the first metal layer and in the active portion of the display device, a second portion of the second routing trace disposed in a second metal layer of the substrate in an inactive portion of the display device, crossing the first routing trace, and coupled to the first portion through a first via, the second routing trace coupled to a first sensor electrode of the plurality of sensor electrodes through a second via; and
    a first bond pad disposed on one of the first metal layer, the second metal layer, and a third metal layer of the substrate, and coupled to the second portion to the second routing trace through a third via in the inactive portion.

2. The input device of claim 1, wherein the plurality of source lines is disposed in the first metal layer.

3. The input device of claim 1, wherein the plurality of source lines is disposed in the second metal layer.

4. The input device of claim 1, wherein the plurality of source lines is disposed in the third metal layer.

5. The input device of claim 1, further comprising a plurality of gate lines disposed in the second metal layer.

6. The input device of claim 5, wherein the plurality of source lines is disposed in one of the first metal layer or the third metal layer.

7. The input device of claim 1, further comprising a plurality of gate lines disposed in the third metal layer.

8. The input device of claim 7, wherein the plurality of source lines is disposed in one of the first metal layer or the second metal layer.

9. The input device of claim 1, wherein the first routing trace and the second routing trace are coupled to an integrated circuit, the integrated circuit is coupled to a first surface of the substrate via the first bond pad, and wherein the second portion of the second routing trace is located beneath the integrated circuit between the first surface and a second surface of the substrate.

10. The input device of claim 1, wherein the first routing trace is coupled to a second sensor electrode of the plurality of sensor electrodes through a fourth via.

11. The input device of claim 1, wherein at least one routing trace of the plurality of routing traces is coupled to an integrated circuit, wherein the integrated circuit is configured to drive the at least one routing trace with a guard signal.

12. The input device of claim 1, wherein each of the sensor electrodes and each of the plurality of routing traces is coupled to a respective pin of a plurality of pins of an integrated circuit.

13. A display device, comprising:
    a substrate having metal layers disposed thereon;
    an active portion having a plurality of display electrodes;
    an inactive portion;
    a plurality of source lines disposed at least partially in the active portion; and
    a plurality of routing traces, each of the plurality of routing traces uniquely couples a respective one of a plurality of sensor electrodes with a respective bond pad of a plurality of bond pads disposed on one of the metal layers, wherein the plurality of routing traces includes:
        a first routing trace, at least a first portion of the first routing trace being disposed in a first metal layer of the metal layers, parallel to a first source line of the plurality of source lines and in the active portion; and
        a second routing trace, a first portion of the second routing trace disposed parallel to the first routing trace in the first metal layer and in the active portion, a second portion of the second routing trace disposed in a second metal layer of the metal layers in the inactive portion, crossing the first routing trace, and coupled to the first portion through a first via, the second routing trace coupled to a first display electrode of the plurality of display electrodes through a first via,
    wherein a first bond pad of the plurality of bond pads is coupled to the second portion of the second routing trace through a third via in the inactive portion.

14. The display device of claim 13, wherein the plurality of source lines is disposed in one of the first metal layer, the second metal layer or a third metal layer of the metal layers.

15. The display device of claim 13, further comprising a plurality of gate lines disposed in one of the second metal layer or a third metal layer of the metal layers.

16. The display device of claim 13, wherein the first routing trace and the second routing trace are coupled to an integrated circuit, the integrated circuit is coupled to a first surface of the substrate via the plurality of bond pads, and wherein the second portion of the second routing trace is located beneath the integrated circuit between the first surface and a second surface of the substrate.

17. The display device of claim 13, wherein the first routing trace is coupled to a second sensor electrode of the plurality of sensor electrodes through a fourth via.

18. The display device of claim 13, wherein at least one routing trace of the plurality of routing traces is coupled to an integrated circuit, wherein the integrated circuit is configured to drive the at least one routing trace with a guard signal.

19. The display device of claim 13, wherein each of the display electrodes and each of the plurality of routing traces is coupled to a respective pin of a plurality of pins of an integrated circuit.

20. A processing system for a capacitive sensing device and display device, the processing system comprising:
    source drivers configured for driving a plurality of source lines disposed at least partially in an active portion of the display device; and
    sensor circuitry configured to be coupled to a plurality of sensor electrodes of the capacitive sensing device through a plurality of routing traces, each of the plurality of sensor electrodes comprising one or more common electrodes of the display device, each of the plurality of routing traces uniquely couples a respective one of the plurality of sensor electrodes with a respective bond pad of a plurality of bond pads, wherein the plurality of routing traces includes:
        a first routing trace, at least a first portion of the first routing trace being disposed in a first metal layer of a substrate, parallel to a first source line of the plurality of source lines and in the active portion of the display device;
        a second routing trace, a first portion of the second routing trace disposed parallel to the first routing trace in the first metal layer and in the active portion of the display device, a second portion of the second routing trace disposed in a second metal layer of the substrate in an inactive portion of the display device, crossing the first routing trace, and coupled to the first portion through a first via the second routing trace coupled to a first sensor electrode of the plurality of sensor electrodes through a second via, the second portion of the second routing trace is coupled to a first bond pad through a third via in the inactive portion, wherein the first bond pad is disposed on one of the first metal layer, the second metal layer, and a third metal layer of the substrate.

21. The processing system of claim 20, wherein the plurality of source lines is disposed in one of the first metal layer, the second metal layer, or the third metal layer.

22. The processing system of claim 20, further comprising gate selection circuitry coupled to a plurality of gate lines disposed in one of the second metal layer or the third metal layer.

23. The processing system of claim 20, wherein the first routing trace is coupled to a second sensor electrode of the plurality of sensor electrodes through a fourth via.

24. The input device of claim 1 further comprising a second bond pad disposed on one of the first metal layer, the second metal layer, and the third meta layer, and coupled to the first routing trace through a fourth via in the inactive portion.

* * * * *